United States Patent
Kor et al.

(10) Patent No.: US 11,401,905 B2
(45) Date of Patent: Aug. 2, 2022

(54) PREDICTIVE POLE SLIP USING TIME SYNCHRONIZATION

(71) Applicant: Cummins Power Generation Inc., Minneapolis, MN (US)

(72) Inventors: Sandeep Kor, Roseville, MN (US); Dennis McDonald, Golden Valley, MN (US)

(73) Assignee: Cummins Power Generation Inc., Minneapolis, MN (US)

( * ) Notice: Subject to any disclaimer, the term of this patent is extended or adjusted under 35 U.S.C. 154(b) by 0 days.

(21) Appl. No.: 17/408,980

(22) Filed: Aug. 23, 2021

(65) Prior Publication Data

US 2022/0056865 A1  Feb. 24, 2022

Related U.S. Application Data

(60) Provisional application No. 63/069,482, filed on Aug. 24, 2020.

(51) Int. Cl.
| | |
|---|---|
| *F02N 11/10* | (2006.01) |
| *F02D 29/06* | (2006.01) |
| *F02D 41/22* | (2006.01) |
| *H02K 7/18* | (2006.01) |
| *H02P 9/02* | (2006.01) |

(52) U.S. Cl.
CPC ............ *F02N 11/108* (2013.01); *F02D 29/06* (2013.01); *F02D 41/22* (2013.01); *H02K 7/1815* (2013.01); *H02P 9/02* (2013.01)

(58) Field of Classification Search
CPC .... F02N 11/10; F02N 11/108; F02N 2200/04; F02D 41/22; F02D 41/221; F02D 29/06; H02K 7/1815; H02P 9/006; H02P 9/02; H02P 9/10; H02P 9/107
USPC .......................... 310/162; 73/114.26, 114.59
See application file for complete search history.

(56) References Cited

U.S. PATENT DOCUMENTS

| | | | |
|---|---|---|---|
| 3,243,620 A * | 3/1966 | Suhr ...................... | H02K 19/14 310/265 |
| 9,093,839 B2 | 7/2015 | De Kock et al. | |

(Continued)

FOREIGN PATENT DOCUMENTS

DE   102017222841 A1 *  6/2019

*Primary Examiner* — Logan M Kraft
*Assistant Examiner* — Robert A Werner
(74) *Attorney, Agent, or Firm* — Foley & Lardner LLP

(57) ABSTRACT

Systems and apparatuses include an alternator including a stator and a rotor structured to be coupled to a crankshaft of a prime mover, and processing circuits structured to: determine a crankshaft position, associate a crankshaft timestamp with the crankshaft position, determine a stator voltage waveform position, associate a stator voltage waveform timestamp with the stator voltage waveform position, determine a common time base using the crankshaft timestamp and the stator voltage waveform timestamp, determine a rotor position based on the crankshaft position and associated with the common time base, determine a load angle based on the rotor position and the stator voltage waveform position using the common time base, compare the load angle to a stability limit, and transmit a predicted pole slip signal to at least one of the prime mover or the alternator to inhibit a pole slip event when the load angle exceeds the stability limit.

20 Claims, 4 Drawing Sheets

(56) References Cited

U.S. PATENT DOCUMENTS

| | | | |
|---|---|---|---|
| 2010/0039077 A1* | 2/2010 | Dalby | H02P 9/009 322/89 |
| 2013/0168960 A1* | 7/2013 | Kalinka | H02P 9/10 290/7 |
| 2016/0187425 A1 | 6/2016 | Fahringer | |
| 2021/0215733 A1* | 7/2021 | Cai | H02K 11/20 |

* cited by examiner

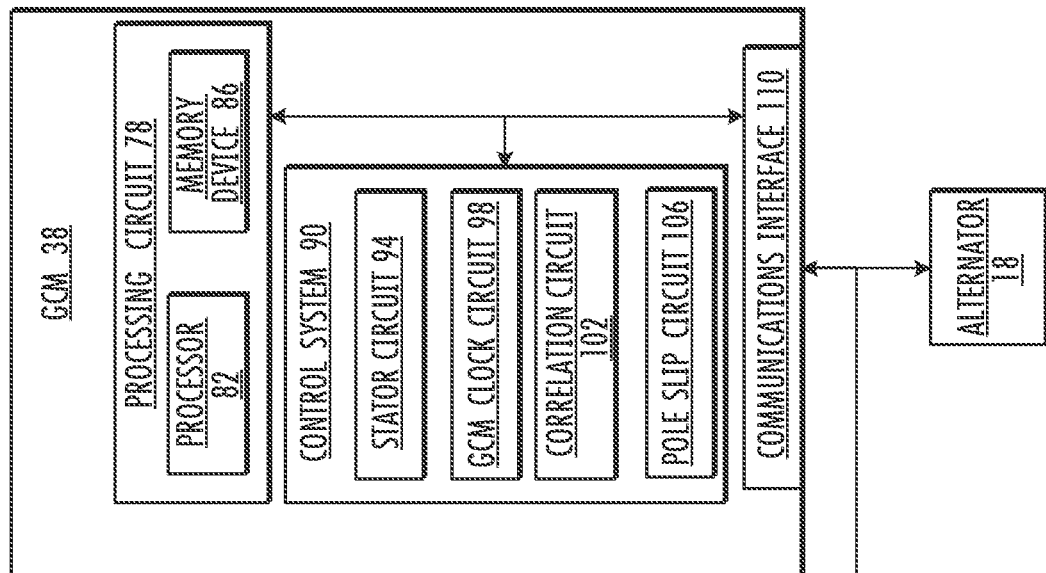
FIG. 4
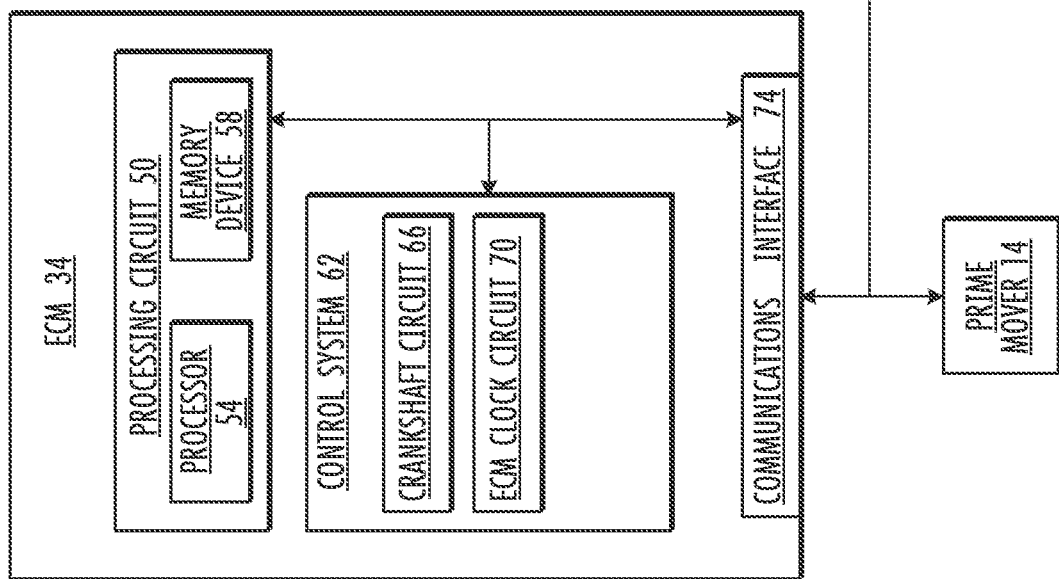

PREDICTIVE POLE SLIP USING TIME SYNCHRONIZATION

CROSS REFERENCE TO RELATED APPLICATIONS

This application claims priority to and the benefit of U.S. Provisional Patent Application No. 63/069,482 filed on Aug. 24, 2020, the entire contents of which are incorporated herein by reference.

TECHNICAL FIELD

The present disclosure relates to generator sets. More particularly, the present disclosure relates to systems and methods for detecting pole slip events in generator sets.

BACKGROUND

A synchronous generator set includes a prime mover (e.g., a diesel engine, a gasoline engine, etc.) driving an alternator to produce electrical energy. In a permanent magnet synchronous generator, a rotor is mounted to a rotor shaft driven by the prime mover and is arranged to rotate within a stator. The rotor includes a field pole and the stator includes an armature conductor. The relative motion between the rotor and the stator induces a voltage in the armature conductor.

When a level of excitation within the alternator is less than that required to keep the synchronous generator's rotor field in rigid synchronism with the stator rotating voltage, the prime mover forces the rotor to rotationally jump forward one pole. This event is known as a pole slip event.

Pole slip events can be caused by excess of prime mover input power caused by a sudden and large loss of load; long fault clearance time; sudden change to the prime mover power level; mains supply network micro-interruption; AVR failure or malfunction—faulty or Loss of Excitation; or poorly executed synchronizing, etc.

SUMMARY

One embodiment relates to a system that includes an alternator including a stator and a rotor structured to be coupled to a crankshaft of a prime mover and rotatable within the stator, and one or more processing circuits comprising one or more memory devices coupled to one or more processors, the one or more memory devices configured to store instructions thereon that, when executed by the one or more processors, cause the one or more processors to: determine a crankshaft position, associate a crankshaft timestamp with the crankshaft position, determine a stator voltage waveform position, associate a stator voltage waveform timestamp with the stator voltage waveform position, determine a common time base using the crankshaft timestamp and the stator voltage waveform timestamp, determine a rotor position based on the crankshaft position and associated with the common time base, determine a load angle based on the rotor position and the stator voltage waveform position using the common time base, compare the load angle to a stability limit, and transmit a predicted pole slip signal to at least one of the prime mover or the alternator to inhibit a pole slip event when the load angle exceeds the stability limit.

Another embodiment relates to a system that includes and engine control circuit and a generator control circuit. The engine control circuit is associated with a prime mover and includes one or more processing circuits comprising one or more memory devices coupled to one or more processors, the one or more memory devices configured to store instructions thereon that, when executed by the one or more processors, cause the one or more processors to: determine a crankshaft position, associate a crankshaft timestamp with the crankshaft position, and transmit the crankshaft timestamp and the associated crankshaft position. The generator control circuit is associated with an alternator that includes a stator and a rotor structured to be coupled to a crankshaft of a prime mover and rotatable within the stator. The generator control circuit includes one or more processing circuits comprising one or more memory devices coupled to one or more processors, the one or more memory devices configured to store instructions thereon that, when executed by the one or more processors, cause the one or more processors to: determine a stator voltage waveform position, associate a stator voltage waveform timestamp with the stator voltage waveform position, receive the crankshaft timestamp and the associated crankshaft position from the engine control circuit, determine a common time base using the crankshaft timestamp and the stator voltage waveform timestamp, determine a rotor position based on the crankshaft position and associated with the common time base, determine a load angle based on the rotor position and the stator voltage waveform position using the common time base, compare the load angle to a stability limit, and transmit a predicted pole slip signal to at least one of the prime mover or the alternator to inhibit a pole slip event when the load angle exceeds the stability limit.

Another embodiment relates to a method that incudes determining a crankshaft position, associating a crankshaft timestamp with the crankshaft position, determining a stator voltage waveform position, associating a stator voltage waveform timestamp with the stator voltage waveform position, determining a common time base using the crankshaft timestamp and the stator voltage waveform timestamp, determining a rotor position based on the crankshaft position and associated with the common time base, determining a load angle based on the rotor position and the stator voltage waveform position using the common time base, comparing the load angle to a stability limit, and transmitting a predicted pole slip signal to at least one of a prime mover or an alternator to inhibit a pole slip event when the load angle exceeds the stability limit.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

FIG. 4 is a schematic representation of an engine control module and the generator control module for a generator set according to some embodiments.

DETAILED DESCRIPTION

Figure 1:
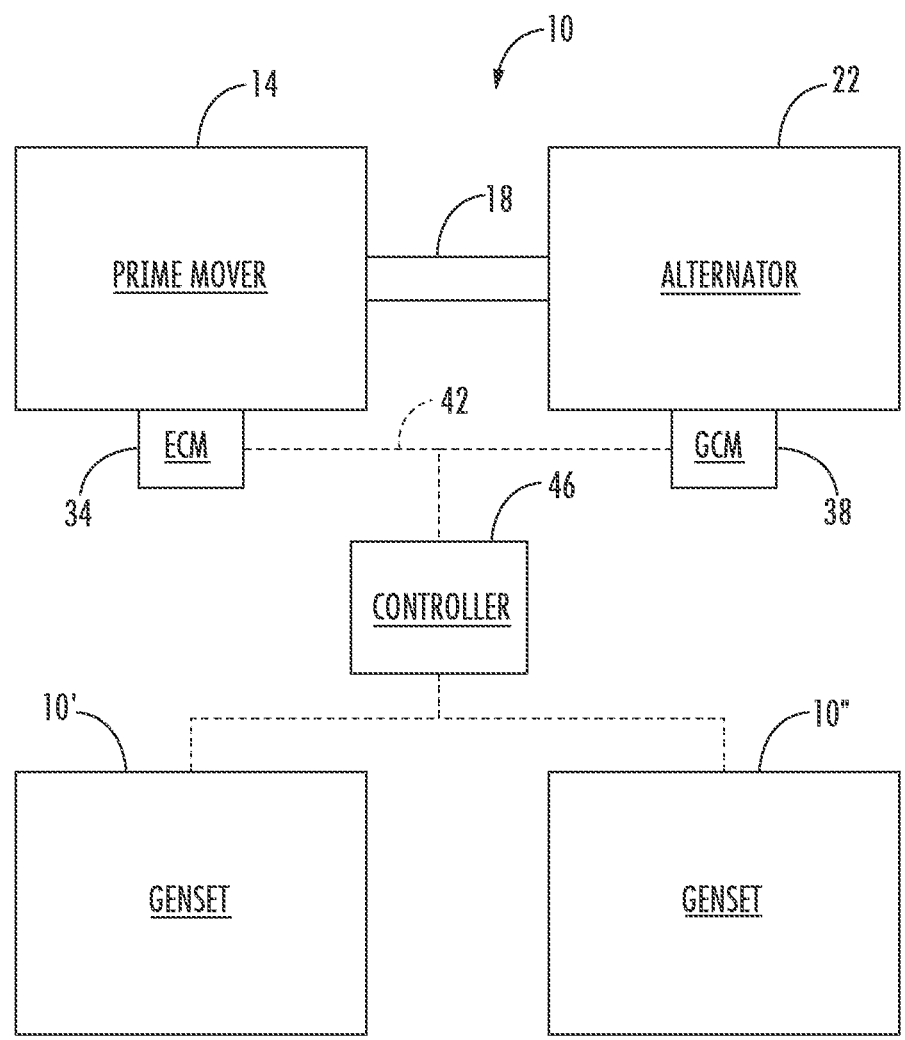
FIG. 1 is a schematic representation of the generator set grid according to some embodiments.

Following below are more detailed descriptions of various concepts related to, and implementations of, methods, apparatuses, and systems for predicting a pole slip event before it has occurred. Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

The rotor shaft of a synchronous generator can experience severe mechanical stress due to torque pulsations during a pole-slip condition. Commercially available protection relays trip a generator after it has pole-slipped one or more times. For example, Impedance Pole-Slip Relays detect pole-slip after the fact and are not accurate in predicting the condition. Other predictive pole-slip implementations require additional external sensors like optical sensors or photoelectric sensors or air gap sensors which either need to the mounted on the alternator rotor or the stator. Depending on the alternator model, mounting the sensors on the rotor or stator may not be possible. Additionally, variability in the construction of different alternator models adds complexity when trying to integrate additional external sensors within the generator. One problem with detecting a pole slip event after occurrence is that severe mechanical damage may have already been inflicted.

Typically, only large generator sets are fitted with protection relays. External sensors need space to be mounted and add to the cost of the generator set—hence only large generators could afford to have pole-slip detection capabilities. However, the growing trend of distributed generation and connecting small and medium sized synchronous generators that are operating in parallel with a utility grid puts even smaller synchronous generators in a potentially damaging situation with respect to pole slip events. As a result, even the smaller sized synchronous generators will advantageously include pole slip event protection which was not provided earlier.

Example systems described herein advantageously utilize both an Engine Control Module (ECM) and a Genset Control Module (GCM) and communication link between the two. The systems provide pole slip protection by predicting a condition without the need for additional sensors.

Some generators are run with a leading power factor. Rising voltage from the leading power factor causes an automatic voltage regulator (AVR) to turn down and reduce an alternator field strength. If the AVR turns all the way off, it loses control of the system voltage resulting in large system voltage spikes. The systems disclosed herein inhibit this scenario and will allow generators to operate closer to the limits of the alternator when working with leading power factors without negatively impacting the health of the alternator.

As shown in FIG. 1, a generator set 10 includes a prime mover 14 (e.g., a diesel engine, gasoline engine, marine engine, etc.) that includes an engine crankshaft 18 coupled to an alternator 22. In some embodiments, a gearbox is coupled between the engine crankshaft 18 and the alternator 22. In some embodiments, the alternator 22 is a permanent magnet generator (PMG) and includes a rotor 26 structured to rotate with the engine crankshaft 18 and relative to a stator 30 to produce electrical energy. An engine control module (ECM) 34 is associate with the prime mover 14 and a genset control module (GCM) 38 is associated with the alternator 22.

A communications link 42 (e.g., J1939 CAN, ethernet) provides communication between the ECM 34 and the GCM 38 and is used to establish a time synchronization between the ECM 34 and GCM 38. In some embodiments, Ethernet connection can provide reduced latency but may add to complexity. A controller 46 is provided to provide communication between the generator set 10, and other generator sets (e.g., a second generator set 10' and a third generator set 10") and a power grid. In some embodiments, aspects of the ECM 34, the GCM 38, and the controller 46 are provided on one or more controllers or are embodied as instructions stored on one or more machine-readable media structured to execute the instructions. Systems described herein can be realized through centralized or distributed control.

The ECM 34 continuously tracks an engine crankshaft position with a high degree of accuracy. Since the engine crankshaft 18 is coupled with the rotor 26 (i.e., a generator rotor), a rotor position can be derived from the engine crankshaft position data. The rotor position data is available without requiring any additional sensors.

The GCM 38 continuously tracks a generator stator voltage waveform using a high accuracy, high sample rate AC Metering implementation.

The rotor position data is communicated to the GCM 38 using the communications link 42. The GCM 38 can then use the rotor position data and the stator voltage waveform data to calculate a load angle.

The generator set 10 uses the load angle data to predict pole slip events. The load angle is continuously computed, logged, and tracked over a period for prognostic purposes. In some embodiments, a cloud-based prognostic service or on-device prognostic algorithm which could analyze the logged load angle data and determine the health of armature windings. Having access to load angle data across multiple generators (e.g., the gensets 10, 10', and 10") running in different applications with different load profiles enables the development of better damage models. Another complimentary benefit of implementing these systems is that the time synchronization between the ECM 34 and the GCM 38 discussed below will lead to causal relationship between events occurring on engine or prime mover 14, generator or alternator 22, and the power system or grid.

The load angle is the angle defined between the magnetic field of the rotor 26 and the resultant magnetic field of the stator 30. The load angle is a good measure of stability of the operating state of the generator set 10. The load angle increases with increasing load and under-excitation. An increasing load angle beyond a predefined threshold is an indication that the generator is committed to a pole slip event. Therefore, real time measurement of the load angle is advantageous.

Real-time measurement of the load angle relies on continuous measurement of the rotor position collected by the ECM 34 and the position of the stator voltage waveform collected by the GCM 38 at the instant the corresponding rotor position was measured. The rotor position and the position of the stator voltage waveform available within the generator set 10 without the requirement of additional sensors. However, the two measurements are made on independent, asynchronous control modules (e.g., the ECM 34 and the GCM 38), and the position of the stator voltage waveform is advantageously correlated to the rotor position at the instant the corresponding rotor position was measured.

One way of correlating the measurements is to hardwire the sensor used by the ECM 34 for crankshaft position detection to the GCM 38. Hardwiring the sensor the GCM 38 does not require any additional sensors, but does involve modifying the existing wiring harness between the ECM 34 and the GCM 38 and is therefore not desirable. Another solution is to add an external sensor to the generator set 10 so that sensing of rotor position can be done at the exact moment the stator voltage waveform is measured by the GCM 38. However, additional sensors add to the cost and the complexity of the generator set 10 and is not therefore desirable.

The generator set 10 provides a common time reference across the ECM 34 and GCM 38 such that measurements taken across the two modules can be coherently used together.

The load angle is continuously calculated by the GCM 38 at a high rate and tracked to understand if the load angle is increasing or decreasing or stable over time. If the value of load angle exceeds a preset stability limit and is increasing (e.g., greater than 90 degrees and increasing), a pole slip event is predicted and a signal to trip the generator set 10 is sent. Additionally, if the value of load angle exceeds a preset slip limit (e.g., greater than 180 degrees), a pole slip event is detected and a signal to trip the generator set 10 is sent.

Successful prediction of a pole slip event relies on four primary concepts. First, a coherent time base is established between the ECM 34 and the GCM 38. Second, the accuracy of time synchronization is maintained using adaptive correction of propagation delays. Third, the load angle is derived using the time synchronized crankshaft position and stator voltage waveform position. Fourth, the pole slip event is predicted by continuously monitoring the load angle and load angle trend.

Figure 2:
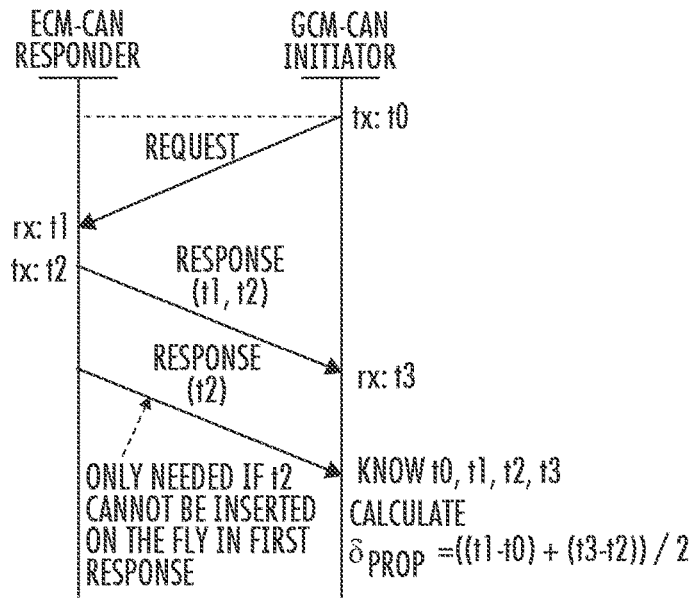
FIG. 2 is a graphical representation of a method of determining a propagation delay in a generator set according to some embodiments.

As shown in FIG. 2, a common time reference is achieved between the ECM 34 and the GCM 34 via the comparison of known times and transmission delays through the communications link 42. Initially, the time can be synchronized between the ECM 34 and the GCM 38 using the ECM 34, the GCM 38, or the controller 46 as the primary control defining the synchronization time.

To determine transmission delays within the system, the GCM 38 uses timestamps and transmits a request at an initial time t0 through the communications link 42. The request is received by the ECM 34 at a first time t1 and the ECM 34 transmits a response at a second time t2. The response is received at the GCM 38 via the communications link 42 at a third time t3. The values of the initial time t0, the first time t1, the second time t2, and the third time t3 are all known, and propagation delay δ_prop can be calculated using the following equation:

$$\delta_{prop} = \frac{[(t1 - t0) + (t3 - t2)]}{2}$$

The ECM 34 communicates an ECM clock time (e.g., t1 and t2) in UTC format every few milliseconds to the GCM 38 over the communications link 42. The GCM 38 receives the clock reading, and after accounting for the propagation delay δ_prop, adjusts the GCM 28 local clock to match the ECM 34 clock to establish time synchronization between the ECM 34 and GCM 38. In some scenarios, the timing of the requests and responses may cause a delay in the transmission of the second time t2 from the ECM 34 to the GCM 38 and the second time t2 can be sent in a separate transmission.

Egress latency is defined as the latency for a communication message from a software measurement plane to a physical media reference plane. Similarly, ingress latency is defined as the latency for a communication message from a physical media reference plane to a software measurement plane. Exemplary timings of these latencies (physical layer delays only) for specific protocols include 512 microseconds for CAN 250K, 256 microseconds for CAN 500K, 206 microseconds for CAN FD, etc. The egress and ingress latencies should be accounted for when the local clocks are being adjusted to remain in time synchronization according to the concept discussed above and shown in FIG. 2.

Figure 3:
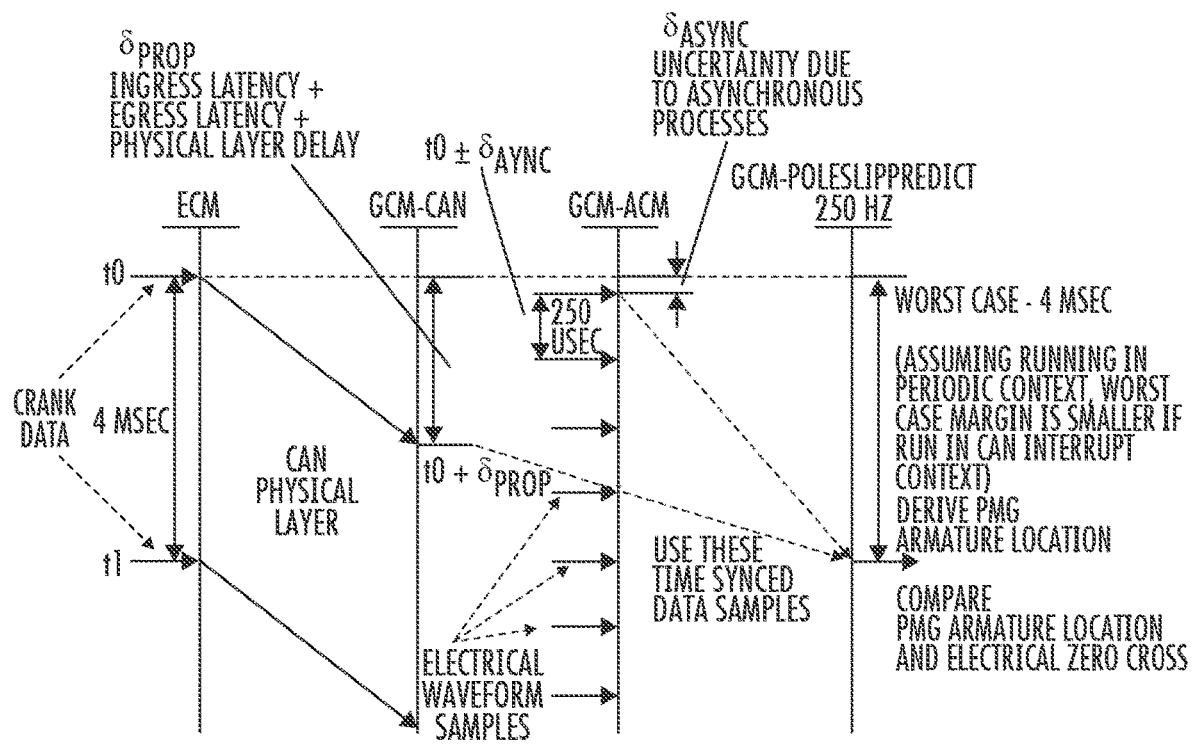
FIG. 3 is a graphical representation of a method of determining a detection latency in a generator set according to some embodiments.

As shown in FIG. 3, the time synchronization discussed above is used to correlate the crankshaft position and therefore the rotor position and the stator voltage waveform position. In some embodiments, a pole slip prediction is checked every electrical half-cycle. The worst case detection latency of a pole slip event for an exemplary 250 Hz process that includes a 4 millisecond sample rate for the crankshaft position data from the ECM 34 and a 250 microsecond sample rate for the stator voltage waveform position is defined as follows:

Latency=sample rate$_{rotor\ position}$+$\delta_{async}$+(Time Sync Accuracy), where δ_async is the uncertainty due to asynchronous processes in the system.

In the above example, the worst case detection latency=4 msec+250 usec+δasync and is constrained such that the propagation delay δ_prop is less than the pole slip process execution rate. (e.g., 4 milliseconds). The worst case detection latency can be made smaller at the cost of additional performance demands on the controllers within the system.

The systems described herein provide predictive pole slip protection with no additional hardware cost and no additional sensors. The solution has a minimal impact on manufacturing as it does not require harness modifications or the complexity of mounting sensors to alternators. Direct communication between the ECM 34 and the GCM 38 removes network latency issues. In some embodiments, where the controller 46 is employed, the GCM 38 (or the ECM 34) can communicate a pole slip health factor or a load angle to the controller 46 such that the computational effort is executed locally by the ECM 34 and the GCM 38 and network latency is removed while still providing communication with the larger system of the multiple gensets 10, 10' and 10". In some embodiments, the controller 46 is eliminated and pole slip prediction and communication is carried out directly between the ECMs 34 and the GCMs 38 of the various gensets 10, 10', and 10". Defining a common timestamp between the ECM 34 and GCM 38 has previously been difficult to achieve and provides advantages in pole slip prediction and in other aspects of generator set control. The systems described above can be applied to transient response with pole slip prediction.

As the components of FIG. 1 are shown to be embodied in the generator set 10, the ECM 34 and the GCM 38 may be structured as one or more electronic control units (ECU). The ECM 34 and the GCM 38 may be separate from or included with the controller 46. The function and structure of the ECM 34 and the GCM 38 are described in greater detail in FIG. 4. In some embodiments, the ECM 34 and the GCM 38 are embodied as instructions stored on one or more memory devices that when executed by one or more processors, execute the instructions to be enacted. The ECM 34 and the GCM 38, or instructions described relative to either the ECM 34 or the GCM 38 below may be saved locally with the ECM 34 and/or the GCM 38, or remotely on another memory device (e.g., the controller 46) such that either localized or distributed control can be realized.

Referring now to FIG. 4, a schematic diagram of the ECM 34 of the generator set 10 of FIG. 1 is shown according to an example embodiment. As shown in FIG. 4, the ECM 34 includes a processing circuit 50 having a processor 54 and a memory device 58, a control system 62 having a crankshaft circuit 66, an ECM clock circuit 70, and a communications interface 74. Generally, the ECM 34 is structured to receive crankshaft position data from the prime mover 14, generate ECM timestamps, and communicate the crankshaft position data and the ECM timestamps to the GCM 38.

Also shown in FIG. 4 is a schematic diagram of the GCM 38 of the generator set 10 of FIG. 1 is shown according to an example embodiment. The GCM 38 includes a processing circuit 78 having a processor 82 and a memory device 86, a control system 90 having a stator circuit 94, a GCM clock circuit 98, a correlation circuit 102, and a pole slip circuit 106, and a communications interface 110. Generally, the GCM 38 is structured to receive the crankshaft position data and the ECM timestamps from the ECM 34, receive stator voltage waveform position data from the alternator 18, generate GCM timestamps and communicate the GCM timestamps to the ECM 34, correlate the ECM timestamps and the GCM timestamps, and use the crankshaft position data and the stator voltage waveform data to predict a pole slip event.

In one configuration, the crankshaft circuit 66, the ECM clock circuit 70, the stator circuit 94, the GCM clock circuit 98, the correlation circuit 102, and the pole slip circuit 106 are embodied as machine or computer-readable media that is executable by one or more processors, such as processors 54 and 82. As described herein and amongst other uses, the machine-readable media facilitates performance of certain operations to enable reception and transmission of data. For example, the machine-readable media may provide an instruction (e.g., command, etc.) to, e.g., acquire data. In this regard, the machine-readable media may include programmable logic that defines the frequency of acquisition of the data (or, transmission of the data). The computer readable media may include code, which may be written in any programming language including, but not limited to, Java or the like and any conventional procedural programming languages, such as the "C" programming language or similar programming languages. The computer readable program code may be executed on one processor or multiple remote processors. In the latter scenario, the remote processors may be connected to each other through any type of network (e.g., CAN bus, etc.).

In another configuration, the crankshaft circuit 66, the ECM clock circuit 70, the stator circuit 94, the GCM clock circuit 98, the correlation circuit 102, and the pole slip circuit 106 are embodied as hardware units, such as electronic control units. As such, the crankshaft circuit 66, the ECM clock circuit 70, the stator circuit 94, the GCM clock circuit 98, the correlation circuit 102, and the pole slip circuit 106 may be embodied as one or more circuitry components including, but not limited to, processing circuitry, network interfaces, peripheral devices, input devices, output devices, sensors, etc. In some embodiments, the crankshaft circuit 66, the ECM clock circuit 70, the stator circuit 94, the GCM clock circuit 98, the correlation circuit 102, and the pole slip circuit 106 may take the form of one or more analog circuits, electronic circuits (e.g., integrated circuits (IC), discrete circuits, system on a chip (SOCs) circuits, microcontrollers, etc.), telecommunication circuits, hybrid circuits, and any other type of "circuit." In this regard, the crankshaft circuit 66, the ECM clock circuit 70, the stator circuit 94, the GCM clock circuit 98, the correlation circuit 102, and the pole slip circuit 106 may include any type of component for accomplishing or facilitating achievement of the operations described herein. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on). The crankshaft circuit 66, the ECM clock circuit 70, the stator circuit 94, the GCM clock circuit 98, the correlation circuit 102, and the pole slip circuit 106 may also include programmable hardware devices such as field programmable gate arrays, programmable array logic, programmable logic devices or the like. The crankshaft circuit 66, the ECM clock circuit 70, the stator circuit 94, the GCM clock circuit 98, the correlation circuit 102, and the pole slip circuit 106 may include one or more memory devices for storing instructions that are executable by the processor(s) of the crankshaft circuit 66, the ECM clock circuit 70, the stator circuit 94, the GCM clock circuit 98, the correlation circuit 102, and the pole slip circuit 106. The one or more memory devices and processor(s) may have the same definition as provided below with respect to the memory devices 58 and 86 and processors 54 and 82. In some hardware unit configurations, the crankshaft circuit 66, the ECM clock circuit 70, the stator circuit 94, the GCM clock circuit 98, the correlation circuit 102, and the pole slip circuit 106 may be geographically dispersed throughout separate locations in the vehicle. Alternatively and as shown, the crankshaft circuit 66, the ECM clock circuit 70, the stator circuit 94, the GCM clock circuit 98, the correlation circuit 102, and the pole slip circuit 106 may be embodied in or within a single unit/housing, or distributed in different permutation between the ECM 34, the GCM 38, and the controller 46.

In the example shown, the ECM 34 and the GCM 38 include the processing circuits 20, 78 having the processors 54, 82 and the memory devices 58, 86. The processing circuits 50, 78 may be structured or configured to execute or implement the instructions, commands, and/or control processes described herein with respect to crankshaft circuit 66, the ECM clock circuit 70, the stator circuit 94, the GCM clock circuit 98, the correlation circuit 102, and the pole slip circuit 106. The depicted configuration represents the crankshaft circuit 66, the ECM clock circuit 70, the stator circuit 94, the GCM clock circuit 98, the correlation circuit 102, and the pole slip circuit 106 as machine or computer-readable media. However, as mentioned above, this illustration is not meant to be limiting as the present disclosure contemplates other embodiments where the crankshaft circuit 66, the ECM clock circuit 70, the stator circuit 94, the GCM clock circuit 98, the correlation circuit 102, and the pole slip circuit 106, or at least one circuit of the crankshaft circuit 66, the ECM clock circuit 70, the stator circuit 94, the GCM clock circuit 98, the correlation circuit 102, and the pole slip circuit 106, is configured as a hardware unit. All such combinations and variations are intended to fall within the scope of the present disclosure.

The hardware and data processing components used to implement the various processes, operations, illustrative logics, logical blocks, modules and circuits described in connection with the embodiments disclosed herein (e.g., the processors 54, 82) may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, or state machine. A processor also may be implemented as a combination of computing devices, such as a combination of a DSP and a microprocessor, a plurality of microprocessors, one or more microprocessors in conjunction with a DSP core, or any other such configuration. In some embodiments, the one or more processors may be shared by multiple circuits (e.g., crankshaft circuit 66, the ECM clock circuit 70, the stator circuit 94, the GCM clock circuit 98, the correlation circuit 102, and the pole slip circuit 106 may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. All such variations are intended to fall within the scope of the present disclosure.

The memory devices 58, 86 (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory devices 58, 86 may be communicably connected to the processors 54, 82 to provide computer code or instructions to the processors 54, 82 for executing at least some of the processes described herein. Moreover, the memory devices 58, 86 may be or include tangible, non-transient volatile memory or non-volatile memory. Accordingly, the memory devices 58, 86 may include database components, object code components, script components, or any other type of information structure for supporting the various activities and information structures described herein.

The crankshaft circuit 66 is structured to monitor the rotational position of the crankshaft 18 and to send crankshaft position data to the GCM 38 via the communication interface.

The ECM clock circuit 70 is structured to maintain a local ECM clock (e.g., in UTC format), and to transmit ECM timestamps correlated with the crankshaft position data to the GCM 38 via the communications interface 74. The ECM clock circuit 70 is also structured to receive GCM timestamps from the GCM 38 via the communications interface 74 and to transmit ECM timestamps in response.

The stator circuit 94 is structured to monitor the stator voltage waveform and assemble stator voltage waveform data including a stator voltage waveform position correlated to a specific time. The stator circuit 94 is also structured to receive the crankshaft position data from the crankshaft circuit 66 of the ECM 34 and determine a rotor position correlated with a time from the crankshaft position data.

The GCM clock circuit 98 is structured to maintain a local GCM clock (e.g., in UTC format), and to transmit GCM timestamps correlated with the stator voltage waveform data. The GCM clock circuit 98 is also structured to receive ECM timestamps from the ECM 34 and to transmit GCM timestamps to the ECM 34 via the communications interface 110. The GCM clock circuit 98 is also structured to direct communication between the ECM clock circuit 70 and to determine a time synchronization or a time correlation between the local ECM clock and the local GCM clock and establish a common time base that can be used to correlate the stator voltage wave position to the rotor position at a single time.

The correlation circuit 102 receives the common time base from the GCM clock circuit 98, the rotor position and the correlated ECM timestamp, and the stator waveform position and the correlated GCM timestamp. Using the common time base, the correlation circuit determines the stator waveform position that correlates with the rotor position and determines a load angle.

The pole slip circuit 106 monitors the load angle over time, determines a load angle trend, and compares the load angle and the load angle trend to a condition. In some embodiments, if the value of load angle exceeds a preset stability limit and is increasing (e.g., greater than 90 degrees and increasing), a pole slip event is predicted and a prediction trip signal to trip the generator set 10 is sent. Additionally, if the value of load angle exceeds a preset slip event limit (e.g., greater than 180 degrees), a pole slip event is detected and a pole slip event signal to trip the generator set 10 is sent. The pole slip circuit 106 is structured to predict upcoming pole slip events before they occur and detect pole slip events after they have happened.

Figure 5:
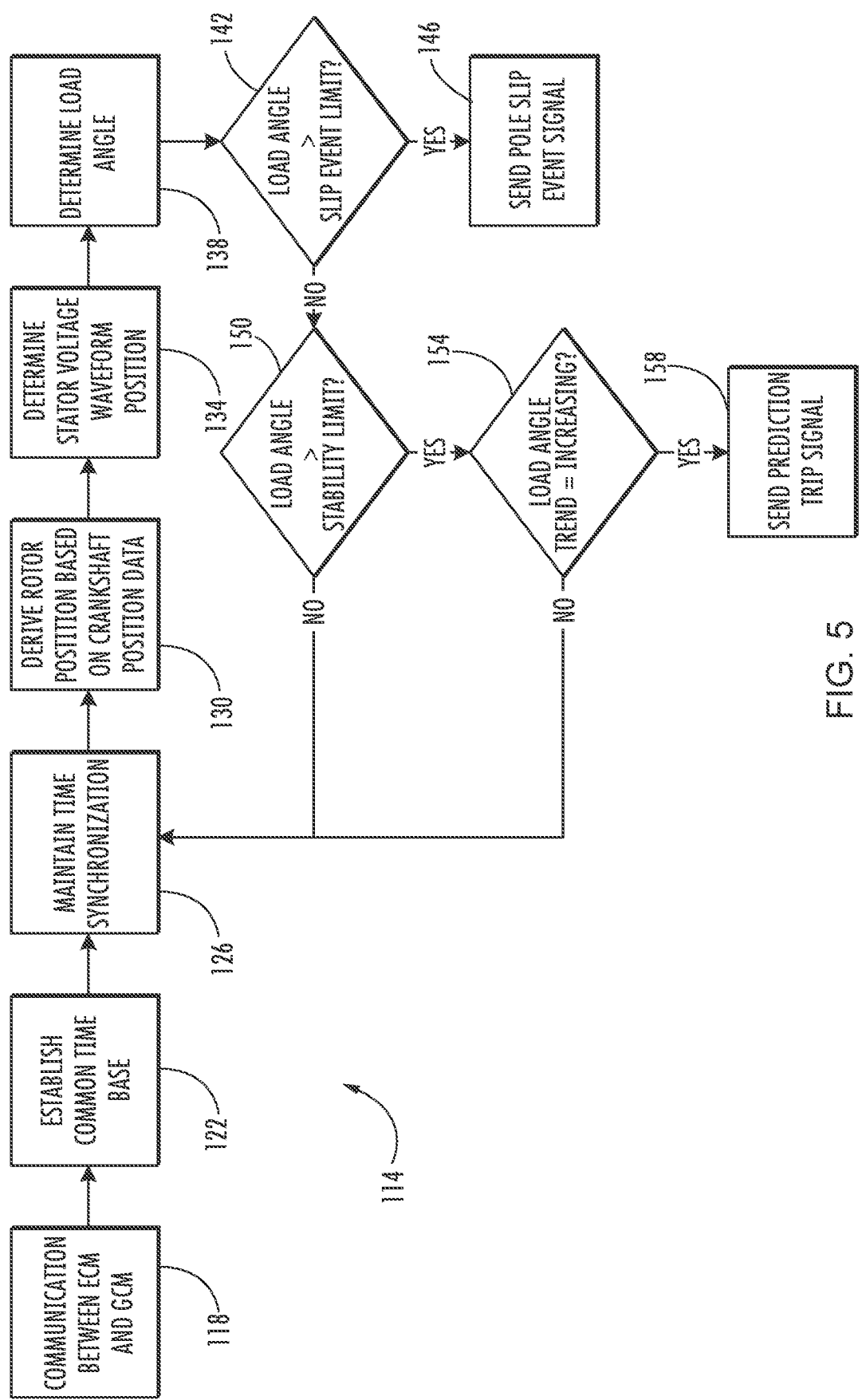
FIG. 5 is a flowchart showing a method of predicting a pole slip event within a generator set according to some embodiments.

Embodiments discussed above may be used to implement a method 114, shown in FIG. 5, of predicting a pole slip event before the event occurs. At step 118, timestamps are exchanged between the ECM 34 and the GCM 38, for example as described relative to FIGS. 2 and 3 above. At step 122, a common time base is established between the ECM 34 and the GCM 38 such that events between the two controllers can be correlated. In some embodiment, the controller 46 can also be time correlated tot eh ECM 34 and GCM 38. At step 126, the synchronization of the ECM 34 and GCM 38 clocks is maintained through monitoring and updating of propagation delays. It is important to maintain the time correlation between the ECM 34 and the GCM 38 over time to enable accurate prediction of pole slip events.

At step 130, the GCM 38 receives crankshaft position information from the ECM 34 and determines a rotor position therefrom. The rotor position is associated with a timestamp in the common time base. At step 134, the GCM 38 determines a stator voltage waveform position associated with a timestamp in the common time base. At step 138, the rotor position and the stator voltage waveform position are correlated in the common time base. Knowing the rotor position and the stator waveform position, a load angle is determined. The load angle is also monitored over time to determine a load angle trend. In some embodiments, the load angle trend can have a value of steady state, decreasing, or increasing.

At step 142, the load angle is compared to a slip event limit. When the load angle is greater than the slip event limit, the method 114 progresses to step 146 and the GCM 38 sends a pole slip event signal indicating that a pole slip event has occurred and the generator set 10 should be stopped. In some embodiments, the slip event limit is 180 degrees.

If the load angle is less than the slip event limit at step 142, the method progresses to step 150 and the load angle is compared to a stability limit. If the load angle is greater than the stability limit, then the load angle trend is examined at step 154. If the load angle trend is increasing, then the GCM 38 sends a prediction trip signal because a pole slip event is predicted. In some embodiments, the prediction trip signal results in a shutdown of the generator set 10. In some embodiments, the stability limit is 90 degrees. In some embodiments, the stability limit may include a range of values (e.g., 85 degrees to 125 degrees). In some embodiments, the load angle must exceed the stability limit for a predetermined amount of time to predict a pole slip event.

If the load angle is less than the stability limit at step 150 or the load angle trend is not increasing at step 154, the method 114 returns to step 126 and the system continues to monitor for predicted pole slip events.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using one or more separate intervening members, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

While various circuits with particular functionality are shown in FIG. 4, it should be understood that the ECM 34, GCM 38, and/or controller 46 may include any number of circuits for completing the functions described herein. For example, the activities and functionalities of the crankshaft circuit 66, the ECM clock circuit 70, the stator circuit 94, the GCM clock circuit 98, the correlation circuit 102, and the pole slip circuit 106 may be combined in multiple circuits or as a single circuit. Additional circuits with additional functionality may also be included. Further, the ECM 34, GCM 38, and/or controller 46 may further control other activity beyond the scope of the present disclosure.

As mentioned above and in one configuration, the "circuits" may be implemented in machine-readable medium for execution by various types of processors, such as the processors 54, 82 of FIG. 4. An identified circuit of executable code may, for instance, comprise one or more physical or logical blocks of computer instructions, which may, for instance, be organized as an object, procedure, or function. Nevertheless, the executables of an identified circuit need not be physically located together, but may comprise disparate instructions stored in different locations which, when joined logically together, comprise the circuit and achieve the stated purpose for the circuit. Indeed, a circuit of computer readable program code may be a single instruction, or many instructions, and may even be distributed over several different code segments, among different programs, and across several memory devices. Similarly, operational data may be identified and illustrated herein within circuits, and may be embodied in any suitable form and organized within any suitable type of data structure. The operational data may be collected as a single data set, or may be distributed over different locations including over different storage devices, and may exist, at least partially, merely as electronic signals on a system or network.

While the term "processor" is briefly defined above, the term "processor" and "processing circuit" are meant to be broadly interpreted. In this regard and as mentioned above, the "processor" may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit or components thereof may be disposed locally (e.g., as part of a local server, a local computing system, etc.) or remotely (e.g., as part of a remote server such as a cloud based server). To that end, a "circuit" as described herein may include components that are distributed across one or more locations.

Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the generator set 10 as shown in the various exemplary embodiments is illustrative only. Additionally, any element disclosed in one embodiment may be incorporated or utilized with any other embodiment disclosed herein. For example, the ECM 34 or functions of the ECM 34 of the exemplary embodiment may be incorporated in the GCM 38 of the exemplary embodiment. In some embodiments, all the processing is done in the ECM 34. In some embodiments, all the processing is done in the GCM 38. In some embodiments, portions of the processing are done in each of the ECM 34 and the GCM 38. In other words, processing is shared between the ECM 34 and the GCM 38. In some embodiments, all or portions of the processing is done in an external controller or circuit that is separate from the ECM 34 and the GCM 38. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A system, comprising:
   an alternator including a stator and a rotor structured to be coupled to a crankshaft of a prime mover and rotatable within the stator; and
   one or more processing circuits comprising one or more memory devices coupled to one or more processors, the one or more memory devices configured to store instructions thereon that, when executed by the one or more processors, cause the one or more processors to:
   determine a crankshaft position,
   associate a crankshaft timestamp with the crankshaft position,
   determine a stator voltage waveform position,
   associate a stator voltage waveform timestamp with the stator voltage waveform position,
   determine a common time base using the crankshaft timestamp and the stator voltage waveform timestamp,
   determine a rotor position based on the crankshaft position and associated with the common time base,
   determine a load angle based on the rotor position and the stator voltage waveform position using the common time base,
   compare the load angle to a stability limit, and
   transmit a predicted pole slip signal to at least one of the prime mover or the alternator to inhibit a pole slip event when the load angle exceeds the stability limit.

2. The system of claim 1, wherein the one or more processing circuits include an engine control circuit and a generator control circuit.

3. The system of claim 2, wherein determining a common time base includes:
   transmitting an initial timestamp from the generator control circuit to the engine control circuit;
   receiving the initial timestamp with the engine control circuit at a first timestamp;
   transmitting a second timestamp from the engine control circuit to the generator control circuit;
   receiving the second timestamp with the generator control circuit at a third timestamp; and
   determining a propagation delay based on the initial timestamp, the first timestamp, the second timestamp, and the third timestamp.

4. The system of claim 2, wherein determining a common time base includes:
   transmitting an initial timestamp from the engine control circuit to the generator control circuit;
   receiving the initial timestamp with the generator control circuit at a first timestamp;
   transmitting a second timestamp from the generator control circuit to the engine control circuit;
   receiving the second timestamp with the engine control circuit at a third timestamp; and
   determining a propagation delay based on the initial timestamp, the first timestamp, the second timestamp, and the third timestamp.

5. The system of claim 2, wherein the engine control circuit and the generator control circuit communicate using J1939 CAN.

6. The system of claim 2, wherein a propagation delay between the engine control circuit and the generator control circuit is based on egress latency, ingress latency, and physical layer delays of the engine control circuit and the generator control circuit.

7. The system of claim 1, wherein a detection latency of the pole slip event is defined as a sum of a rotor position sample rate, a stator voltage waveform sample rate, and a time synchronization accuracy factor.

8. The system of claim 1, wherein the predicted pole slip signal is transmitted before the pole slip event has occurred.

9. A system comprising:
   an engine control circuit associated with a prime mover and including one or more processing circuits comprising one or more memory devices coupled to one or more processors, the one or more memory devices configured to store instructions thereon that, when executed by the one or more processors, cause the one or more processors to:
   determine a crankshaft position,
   associate a crankshaft timestamp with the crankshaft position, and
   transmit the crankshaft timestamp and the associated crankshaft position; and
   a generator control circuit associated with an alternator including a stator and a rotor structured to be coupled to a crankshaft of a prime mover and rotatable within the stator, the generator control circuit including one or more processing circuits comprising one or more memory devices coupled to one or more processors, the one or more memory devices configured to store instructions thereon that, when executed by the one or more processors, cause the one or more processors to:

determine a stator voltage waveform position,
associate a stator voltage waveform timestamp with the stator voltage waveform position,
receive the crankshaft timestamp and the associated crankshaft position from the engine control circuit,
determine a common time base using the crankshaft timestamp and the stator voltage waveform timestamp,
determine a rotor position based on the crankshaft position and associated with the common time base,
determine a load angle based on the rotor position and the stator voltage waveform position using the common time base,
compare the load angle to a stability limit, and
transmit a predicted pole slip signal to at least one of the prime mover or the alternator to inhibit a pole slip event when the load angle exceeds the stability limit.

10. The system of claim 9, wherein determining a common time base includes:
transmitting an initial timestamp from the generator control circuit to the engine control circuit;
receiving the initial timestamp with the engine control circuit at a first timestamp;
transmitting a second timestamp from the engine control circuit to the generator control circuit;
receiving the second timestamp with the generator control circuit at a third timestamp; and
determining a propagation delay based on the initial timestamp, the first timestamp, the second timestamp, and the third timestamp.

11. The system of claim 9, wherein determining a common time base includes:
transmitting an initial timestamp from the engine control circuit to the generator control circuit;
receiving the initial timestamp with the generator control circuit at a first timestamp;
transmitting a second timestamp from the generator control circuit to the engine control circuit;
receiving the second timestamp with the engine control circuit at a third timestamp; and
determining a propagation delay based on the initial timestamp, the first timestamp, the second timestamp, and the third timestamp.

12. The system of claim 9, wherein the predicted pole slip signal is transmitted before the pole slip event has occurred.

13. The system of claim 9, wherein the engine control circuit and the generator control circuit communicate using J1939 CAN.

14. The system of claim 9, wherein a propagation delay between the engine control circuit and the generator control circuit is based on egress latency, ingress latency, and physical layer delays of the engine control circuit and the generator control circuit.

15. The system of claim 9, wherein a detection latency of the pole slip event is defined as a sum of a rotor position sample rate, a stator voltage waveform sample rate, and a time synchronization accuracy factor.

16. The system of claim 9, wherein comparing the load angle to a stability limit includes comparing a trend of the load angle to the stability limit.

17. A method comprising:
determining a crankshaft position;
associating a crankshaft timestamp with the crankshaft position;
determining a stator voltage waveform position;
associating a stator voltage waveform timestamp with the stator voltage waveform position;
determining a common time base using the crankshaft timestamp and the stator voltage waveform timestamp;
determining a rotor position based on the crankshaft position and associated with the common time base;
determining a load angle based on the rotor position and the stator voltage waveform position using the common time base;
comparing the load angle to a stability limit; and
transmitting a predicted pole slip signal to at least one of a prime mover or an alternator to inhibit a pole slip event when the load angle exceeds the stability limit.

18. The method of claim 17, wherein determining a common time base includes:
transmitting an initial timestamp from a generator control circuit to an engine control circuit;
receiving the initial timestamp with the engine control circuit at a first timestamp;
transmitting a second timestamp from the engine control circuit to the generator control circuit;
receiving the second timestamp with the generator control circuit at a third timestamp; and
determining a propagation delay based on the initial timestamp, the first timestamp, the second timestamp, and the third timestamp.

19. The method of claim 17, wherein determining a common time base includes:
transmitting an initial timestamp from an engine control circuit to a generator control circuit;
receiving the initial timestamp with the generator control circuit at a first timestamp;
transmitting a second timestamp from the generator control circuit to the engine control circuit;
receiving the second timestamp with the engine control circuit at a third timestamp; and
determining a propagation delay based on the initial timestamp, the first timestamp, the second timestamp, and the third timestamp.

20. The method of claim 17, wherein the predicted pole slip signal is transmitted before the pole slip event has occurred.

* * * * *